United States Patent [19]

Kobayashi et al.

[11] Patent Number: 4,656,494
[45] Date of Patent: Apr. 7, 1987

[54] AVALANCHE MULTIPLICATION PHOTODIODE HAVING A BURIED STRUCTURE

[75] Inventors: Masahiro Kobayashi, Inagi; Susumu Yamazaki, Hadano; Takashi Mikawa, Tokyo; Kazuo Nakajima; Takao Kaneda, both of Kawasaki, all of Japan

[73] Assignee: Fujitsu Limited, Kanagawa, Japan

[21] Appl. No.: 738,724

[22] Filed: May 29, 1985

[30] Foreign Application Priority Data

May 31, 1984 [JP] Japan ................. 59-109433

[51] Int. Cl.$^4$ .......................................... H01L 27/14
[52] U.S. Cl. ...................................... 357/30; 357/13;
357/58; 357/16; 357/55; 357/56
[58] Field of Search ............... 357/13 U, 13 Z, 58,
357/30, 16, 55, 30 A, 30 E, 30 D, 30 I, 56

[56] References Cited

U.S. PATENT DOCUMENTS

| 4,442,444 | 4/1986 | Osaka ............................ 357/13 |
| 4,481,523 | 11/1984 | Osaka et al. .................. 357/13 X |

FOREIGN PATENT DOCUMENTS

| 2458145 | 12/1980 | France ............................ 357/30 A |
| 52-6097 | 1/1977 | Japan ............................. 357/52 D |
| 54-107291 | 8/1979 | Japan ............................. 357/30 A |
| 55-13957 | 1/1980 | Japan ............................. 357/30 A |
| 55-124278 | 9/1980 | Japan ............................. 357/30 A |

OTHER PUBLICATIONS

Lucas, "Detectors for Fibre-Optic Communication," *Proc. IEE*, vol. 123, No. 6, Jun. 1976, pp. 623-626.

Primary Examiner—J. Carroll
Assistant Examiner—William A. Mintel
Attorney, Agent, or Firm—Armstrong, Nikaido, Marmelstein & Kubovcik

[57] ABSTRACT

A buried structure avalanche multiplication photodiode (APD) is provided with a surface level difference between the multiplication region and guard ring region. The APD has a so-called separated absorption and multiplication region structure comprising an n-InGaAs light absorbing layer and an n-InP multiplication layer. The surface level difference is provided by selective growth of the layer in which the guard ring is formed or selective removal of the layer over the multiplication region. In the APD, the pn junction is level throughout the multiplication region and guard ring region or is made farther apart from the light absorbing layer in the guard ring region than in the multiplication region, and a significant reduction of dark current due to tunneling current in the InGaAs layer and/or InGaAsP layer is obtained. Moreover, the breakdown voltage difference of the pn junction in the multiplication region and the guard ring region has also been increased.

13 Claims, 15 Drawing Figures

AVALANCHE MULTIPLICATION PHOTODIODE HAVING A BURIED STRUCTURE

BACKGROUND OF THE INVENTION

The present invention relates to a semiconductor photodetector, and more specifically, it relates to an avalanche multiplication photodiode having a buried structure.

In photodetectors for long-distance light communications system, the most promising type is the avalanche photodiode (APD) comprising an InGaAs/InP system.

The maximum utilization of the optical transmission characteristics of a quartz fiber light guide requires the use of light in the 1 μm band, especially light of a wave length of 1.3 μm or 1.6 μm. By using light of the above wave length, a light communications system is capable of transmission with a bit-rate more than a few hundred megabits per second over a transmission span of a few tens of kilometers without a repeater. For such a long transmission span, an APD is indispensable because of its high response speed and high gain based on the avalanche multiplication of photo-induced carriers.

In a short span light communication system for the 1 μm band, the Ge-APD is already in practical use, however, its relatively low S/N ratio characteristic limits its use for transmission over a long span. On the other hand, the APD comprising the InGaAs/InP system features lower noise and higher response speed compared with Ge-APD, especially at a 1.6 μm, wavelength thanks to the relatively larger ionization rate ratio in InP, and is expected to be more suitable for applications in the aove mentioned long-span light communications.

An exemplary configuration of an InGaAs/ InP APD is illustrated in cross-section in FIG. 1. Referring to FIG. 1, stacked layers of an n-type InGaAs layer 2 (the notation of tye type is simply represented by n-, for example, hereinafer) and an n-InP layer 3 are formed on an InP substrate 1. The n-InGaAs layer 2 is for absorbing light in the 1 μm band and the n-InP layer 3 having a mesa structure 31 is for constituting an avalanche multiplication region (simply referred to as multiplication region hereinafter), as shown in FIG. 1. Between the n-InGaAs layer 2 and n-InP layer 3 is an n-InGaAsP layer 21, which is for improving the response speed degradation caused by the hole pile-up at the hetero-interface, as explained later.

Around the mesa 31 of the n-InP layer 3 is formed an n⁻-InP layer 4 for constituting a guard ring region. That is, the mesa of the n-InP layer 3 is embedded in a layer having a relatively low concentration of impurity type. The n⁻-InP layer 4 is selectively doped with a p-type impurity together with the doping of the same impurity as in the mesa portion of the n-InP layer 3. Thus, a p-type region, hence, a pn junction, is formed to extend horizontally across the layers 3 and 4.

In FIG. 1, reference 5 denotes a portion in the mesa of n-InP layer 3 converted into p-type material, and dotted line 8 denotes a so-called shallow front of the diffused impurity. This front is a specific property of the diffusion in III-V compound semiconductor single crystals having an impurity of relatively low concentration. Also, AB indicates a multiplication region including the mesa 31 of n-InP layer 3 and GR indicates a guard ring region formed in n⁻-InP layer 4.

On the surface of the guard ring region GR is formed an electrode 6 to enclose the surface of the multiplication region AB, while on the back-side surface of the InP substrate 1 is formed another electrode 7. When a reverse bias voltage of a sufficient magnitude is applied between the electrodes 6 and 7 along the direction from the InP substrate 1 to the p-type region 5, the APD can operate in an avalanche multiplication mode.

The APD of FIG. 1 has a separated structure of a light absorption layer (n-InGaAs layer 2) and an avalanche multiplication layer (n-InP layer 3), as proposed by N. Susa, et al., (see "new InGaAs/InP Avalanche Photodiodes Structure for the 1-1.6 μm Wavelength Region", *IEEE Journal of Quantum Electronics*, QE-16, 864, 1980). This structure is intended to eliminate the tunneling current in the n-InGaAs layer. The tunneling current is due to the relatively narrow band gap (0.75 eV) and small effective mass of the electrons in the n-InGaAs layer, and causes a dark current to reduce the S/N characteristic of the APD.

The APD of FIG. 1 is also formed to to have a structure of the buried n-InP multiplication layer 3 as proposed by K. Yasuda, et al. including some inventors of the present invention, (see "InP/InGaAs Buried-Structure Avalanche Photodiodes", *Electronic Letters*, Feb. 16, 1984 Vol. 20, No. 4 pp. 158-159). This buried structure features the high-impurity-concentration n-InP multiplication layer 3 buried in the low-impurity-concentration n⁻-InP layer 4, thereby providing an enhanced function of the guard ring formed therein. The buried-structure APD is based on a principle that a pn junction formed in a semiconductor having an impurity of relatively low concentration, such as the n⁻-InP layer 4, has a higher breakdown voltage compared with that formed in a semiconductor having an impurity of relatively higher concentration, such as n-InP layer 3.

However, in the APD of FIG. 1, the depth from the surface of the device to the pn junction formed across the mesa 31 of n-InP layer 3 and the n⁻-InP layer 4 is not equal in the guard ring region GR and the multiplication region AB. There is a general characteristic in semiconductors having the same lattice constant that the lower the carrier concentration or the wider the band gap, the deeper the pn junction formed therein by using impurity diffusion. Accordingly, the pn junction thus formed is nearer to the n-InGaAs light absorbing layer 2 in the n⁻-InP layer 4 than in the mesa 31 of the n-InP layer 3. That is, the distance between the pn junction and the InGaAs light absorbing layer 2 is smaller in the guard ring region GR compared with the multiplication region AB, and the effective thickness of the n⁻-InP layer 4 is decreased.

In the APD as shown in FIG. 1, the InP substrate 1 is provided with an impurity of high concentration (e.g. on the order of $10^{18}$ cm$^{-3}$ compared with $10^{15}$ to $10^{16}$ cm$^{-3}$ in the n-InGaAs light absorbing layer 2, n-InP layer 3, etc.), therefore, when an external reverse bias voltage is applied between the electrodes 6 and 7, the depletion layer spreads from the pn junction toward the interface of the n-InGaAs layer 2 and n-InP substrate 1. This means that the electrical field generated in the guard ring region GR is stronger than that formed in the multiplication region AB because of the unevenness between the pn junction in the multiplication region AB and guard ring region GR.

This unevenness between the pn junction in the multiplication region AB and guard ring region GR is probable even when ion implantation or epitaxial growth technology is employed for forming the pn junction because of the accompanying thermal process used to anneal and activate the impurities.

It is important for the design of an APD that the electrical field distribution in the APD must be designed so that the field in the n-InP layer 3, especially in the depletion layer near the pn junction in the mesa 31, must be large enough to cause avalanche multiplication, and the respective electrical fields in the n-InGaAsP layer 21 and n-InGaAs layer 2, in particular, at the respective hetero-interfaces, must be small enough to suppress the tunneling current in the layers. Moreover, the pn junction in the guard ring region is required not to cause breakdown under application of the external reverse bias voltage for producing the avalanche multiplication.

Furthermore, the electrical fields at the respective hetero-interfaces must properly be adjusted to correlate with one another in view of the dark current due to the tunneling electrons and the aforesaid hole pile-up phenomena. If n-InGaAs layer 2 directly intefaces n-InP layer 3, a valence band discontinuity forming a barrier of a height of about 0.4 eV appears. This barrier acts as a trap for the holes generated in the n-InGaAs light absorbing layer 2, and the delayed release of holes from the trap operates to decrease the response speed of the APD. In other words, a certain magnitude of electrical field is required at the hetero-interface between the n-InGaAs layer 2 and n-Inp layer 3 in order to provide the holes with sufficient energy to surmount the barrier. The estimated value for this electrical field is about $3 \times 10^5$ V/cm or more for an interface made on the (111) A-oriented surface of an InP substrate by using a liquid phase epitaxy (LPE) technique, for example.

However, the electrical field necessary to suppress the tuneling electrons through the n-InGaAs layer 2 must be less than about $2.3 \times 10^5$ V/cm. These contradictory requirements for the electrical fields can be overcome by introducing an intermediate n-InGaAsP layer 21 which reduces the effective barrier height between the hetero-interface of the n-InGaAs layer 2 and InP layer 3, thereby improving the response speed degradation caused by the hole pile-up at the hetero-interface. (See "InGaAs Avalanche Photodiodes for 1 μm Wavelength Region" *Electronics Letters*, July 7, 1983, Vol 19, No. 14, pp. 534–536, by T. Shirai, et al. including some inventors of the present invention.) As an equivalent, a so-called transition layer, in which the energy band gap is continuously changed from the 1.35 eV of InP to the 0.75 eV of InGaAs, can be used to substitute for the n-InGaAsP intermediate layer 21.

In the APD of FIG. 1, to suppress the tunneling current and the hole pile-up, the electrical field at the hetero-interface of the n-InGaAsP layer 21 and the n-InP layer 3 must be between $3.5 \times 10^5$ and $2.5 \times 10^5$ V/cm, and that at the hetero-interface of the n-InGaAsP layer 21 and n-InGaAs layer 2 must be between $2.3 \times 10^5$ and $1.5 \times 10^5$ V/cm, when each of the layers are formed on an (111)A- oriented surface of the InP substrate 1 by using a conventional LPE technique under dissolution free conditions, for example.

These electrical field conditions must be satisfied in both the multiplication region AB and guard ring region GR. However, the difference in the electrical field distributions in the multiplication region and guard ring region due to the unevenness of betwen the pn junction, and the difference in the carrier concentrations of the multiplication region AB and guard ring region GR imposes difficulties on the design, fabrication and operation of the APD.

That is, the degree in latitude of the design parameters of the APD is decreased and severe process controls are imposed to achieve these design parameters. The parameters include, for example, the respective thicknesses of and the impurity concentration in each of the layers 2, 21, 3 and 4 and the diffusion depth of the impurity for creating the pn junction. Moreover, the operational margin of the APD is inevitably reduced. These disadvantages result in the low manufacturing yield and high cost of the APD, and further, limit the practical application possibilities of the APD.

SUMMARY OF THE INVENTION

It is an object of the present invention to provide an APD for the 1 μm band with the characteristics of a high S/N ratio and a high response speed.

It is another object of the present invention to provide a buried-structure APD having a pn junction extending across the multiplication region and the guard ring region substantially in parallel to the interface of the buried multiplication layer and light absorbing layer, wherein the distance between the pn junction and the interface in the multiplication region is substantially equal to or smaller than that in the guard ring region.

It is still another object of the present invention to provide a buried-structure APD having a large operational margin.

It is yet another object of the present invention to provide a method for fabricating a buried-structure APD having a high yield and low cost.

It is still yet another object of the present invention to provide a method for fabricating a buried-structure APD of high reliability.

The above objects can be attained by providing a buried-structure APD with a surface level difference between the multiplication region and guard ring region wherein the surface of the multiplication region is lower than that of the guard ring region. More precisely, a first semiconductor layer having an impurity of relatively high concentration is formed on a light absorbing layer and is then formed into a mesa structure for constituting a multiplication region, and a second semiconductor layer having the same conductivity type impurity of relatively low concentration is formed around the mesa of the first semiconductor layer so that the mesa is embedded therein. The surface level difference is provided by selectively growing the second semiconductor layer for forming a mask on the surface of the mesa in advance, or selectively removing the surface of the second semiconductor layer on the mesa instead. In the APD of the present invention, the pn junction formed to extend across the multiplication region and guard ring region is at an equal level or is made farther from the light absorbing layer in the guard ring region compared with that in the multiplication region, thereby eliminating the aforesaid problem due to difficulties in the control of the electrical fields at each hetero-interface in the conventional APD.

BRIEF DESCRIPTION OF DRAWINGS

The above and other objects and advantages of the present invention will be more apparent from the following description of the preferred embodiments with reference to the accompanying drawings, wherein.

DESCRIPTION OF THE PREFERRED EMBODIMENTS

Figure 1:
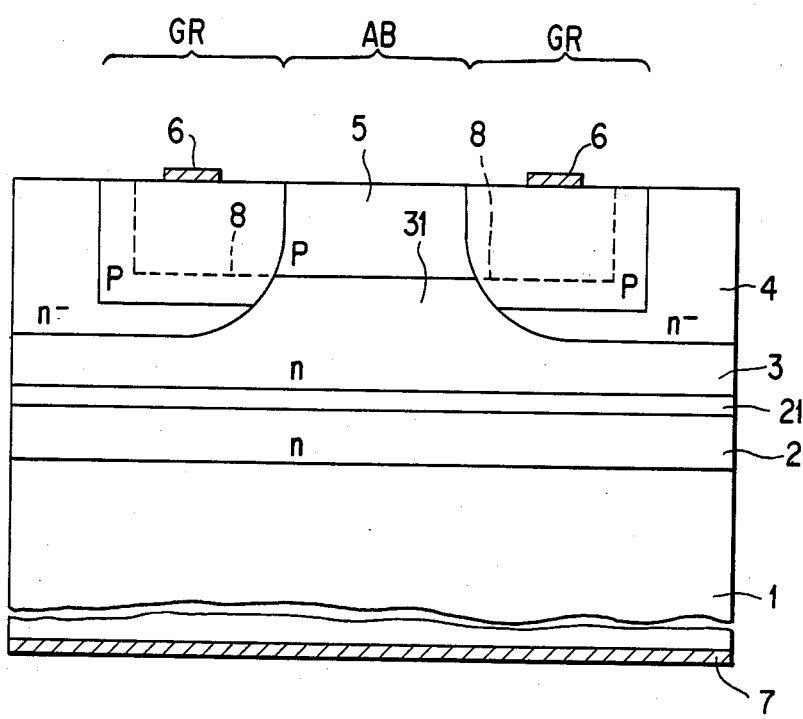
FIG. 1 is a cross-section showing an exemplary configuration of an InGaAs/InP APD of the prior art.
Figure 2:
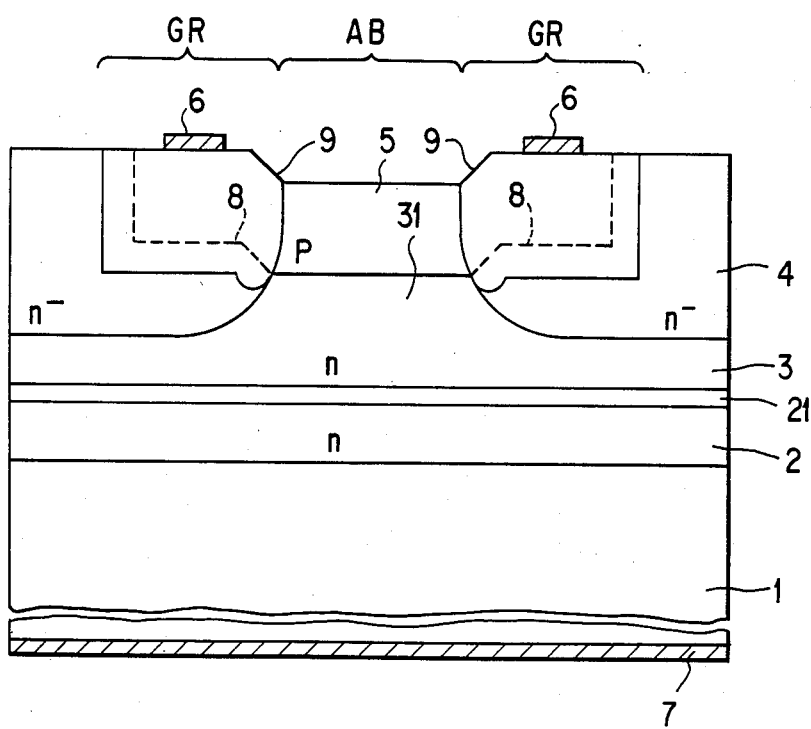
FIG. 2 is a cross-section of an APD according to the present invention.

FIG. 2 is a cross-section of an APD according to the present invention. The configuration of the APD in FIG. 2 is almost the same as shown in FIG. 1, and like references designate like or corresponding parts in FIG. 1.

However, in the APD of FIG. 2, there is provided a difference in level between the respective surfaces of the multiplication region AB and the guard ring region GR so that the surface level of the multiplication region AB is lower than that of the guard ring region GR. Moreover, a slope 9 is provided between the surfaces. Hence, the pn junction across the mesa 31 of the n-InP layer 3 (the first semiconductor layer) and that across the n$^-$-InP layer 4 (the second semiconductor layer) are formed substantially at the same level, thanks to the aforementioned surface level difference. That is, as described before with reference to FIG. 1, the pn junction formed by an impurity diffusion is deeper in a layer such as the n$^-$-InP layer 4 having relatively high carrier concentration, accordingly, a deeper pn junction is formed in the n$^-$-InP layer 4 compared with that in the mesa 31 of the n-InP layer 3. In other words, the value of the surface level difference between the multiplication region AB and guard ring region GR is determined according to the relation between the depths of the pn junctions formed by the diffusion of a p-type impurity for providing the function of a carrier concentration in the InP layer.

If the pn junction is made to extend at the same level across the mesa 31 into the n$^-$-InP layer 4, the respective electrical field distributions in the multiplication region AB and the guard ring region GR are made very similar, and therefore, the electrical field at each hetero-interface between the n-InP layer 3 and n-InGaAsP layer 21, or between the n-InGaAsP layer 21 and n-InGaAs layer 2 is almost or substantially equal throughout the multiplication region AB and the guard ring region GR. In this configuration, the breakdown voltage difference between the pn functions in the multiplication region AB and guard ring region Gr is still maintained or can be increased more than the APD as shown in FIG. 1.

The higher breakdown voltage of the pn junction in the guard ring region can also be obtained with the use of a semiconductor having a relatively wider energy band gap ($\epsilon_g$) for constituting the guard ring region. For example, a layer of an n-Al$_{0.48}$In$_{0.52}$As ($\epsilon_g$=1.45 eV) can be used to substitute for the n$^-$-InP layer 4 ($\epsilon_g$=1.35 eV).

Figure 3:
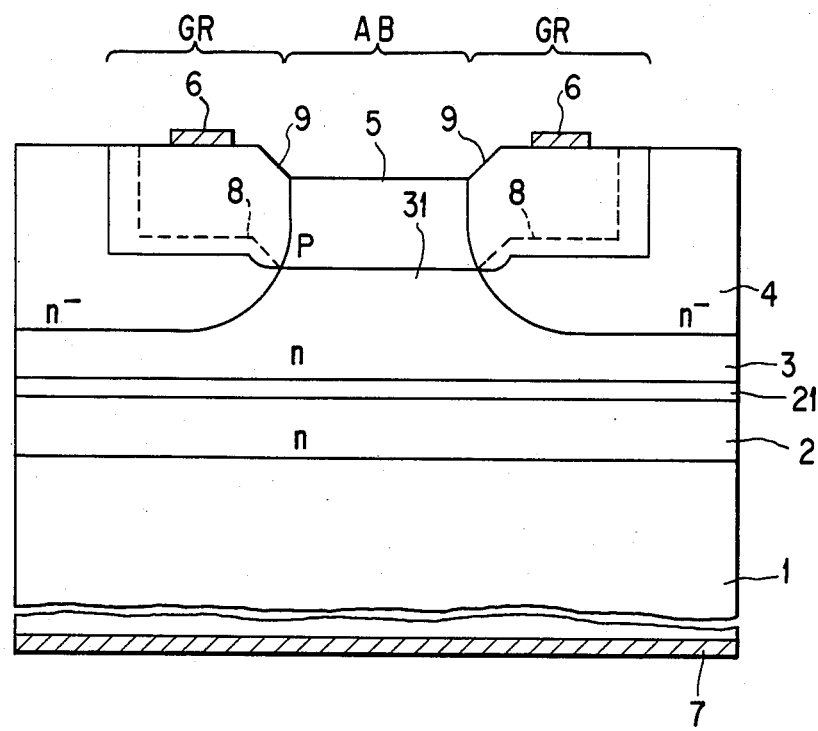
FIG. 3 is a cross-section showing a second embodiment of the APD according to the present invention.

FIG. 3 is a cross-section showing a second embodiment of an APD according to the present invention. This embodiment is intended to enhance the effect of the surface level difference between the multiplication region AB and guard ring region GR as provided in the first embodiment. In this second embodiment, compared with the first embodiment, the pn junction is not formed at an equal level throughout the multiplication region AB and the guard ring region GR, but is formed so that its distance to the light absorbing layer is larger in the guard ring region than in the multiplication region.

In the APD of FIG. 2, the surface level difference is determined so that the pn junction is formed at the same level throughout the multiplication region and guard ring region, however, in the APD shown in FIG. 3, a further larger level difference is provided between the respective surfaces of the multiplication region AB and the guard ring region GR. Accordingly, when a p-type impurity is diffused from the surfaces of the multiplication region AB and guard ring region GR, the distance from the pn junction formed therewith to the n-InGaAs light absorbing layer 2 is relatively larger in the n$^-$-InP layer 4 than in the mesa 31 of n-InP layer 3. As a result, the electrical field strength at each hetero-interface in the guard ring region GR can be weaker compared with each corresponding hetero-interface in the multiplication region AB. This means that the restriction on the electrical field to suppress tunneling current can substantially be eliminated. And the breakdown voltage difference between the multiplication region AB and guard ring region GR is increased compared with that in the first embodiment. Hence, the degree of latitude in the design and process control and the operational margin region can be extended further in this second embodiment APD.

The slope 9 between the respective surfaces of the multiplication region AB and guard ring region GR provides a gradual pn junction level change between the multiplication region AB and guard ring region GR. The larger radius of curvature of the pn junction is advantageous for preventing the local-breakdown which is probable in the pn junction having abrupt level change as in FIG. 1, thereby improving the reliability of the APDs according to the present invention.

Figure 4:
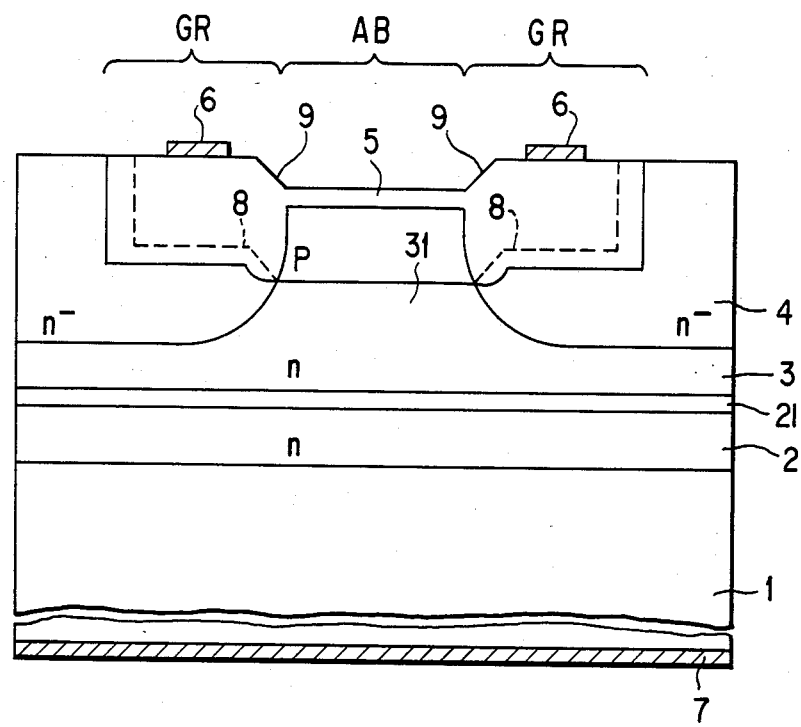
FIG. 4 is a cross-section showing a third embodiment of an APD according to the present invention.

FIG. 4 is a cross-section showing a fourth embodiment of an APD according to the present invention. In this embodiment, the second semiconductor layer 4, for example, an n$^-$-InP layer, is formed on and around the mesa of the first semiconductor layer 3, for example, an n-InP layer. The surface level difference between the multiplication region AB and the guard ring region GR is provided similar to the previous embodiments. Although shown in FIG. 4 is an APD having a non-level pn junction extending across the mesa 31 of the n-InP layer 3 into the n$^-$-InP layer 4, depending on the magnitude of the surface level difference provided between the multiplication region AB and guard ring region GR, the object of this embodiment is unaffected if the pn junction is formed at the same level throughout the multiplication region AB and guard ring region GR as in the APD of the first embodiment shown in FIG. 2.

The configuration of the third embodiment shown in FIG. 4 is advantageous for the fabrication of the APD, because the magnitude of the surface level difference can be properly adjusted in a cut and try method during the process of selectively removing the surface layer of the multiplication region AB. This means that the conditions for growing the n⁻-InP layer 4 can independent from the parameters for providing the necessary surface level difference.

FIGS. 5(a) to 5(h) show the fabrication steps of the APD of the first embodiment, each illustrating the cross-section at one step. Details of the steps are described in the following with reference to the figures.

Figure 5A:
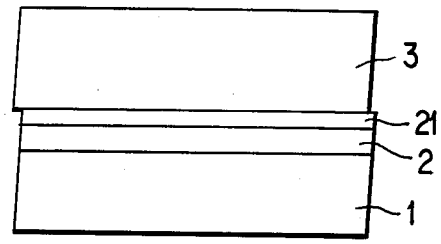
FIGS. 5(a) to 5(h) show the fabrication steps of the APD of the first embodiment, illustrating a cross-section at each step.

(a) By employing a liquid-phase epitaxy (LPE) technique, for example, each of an n-InGaAs light absorbing layer 2, n-InGaAsP intermediate layer 21 and n-InP avalanche multiplication layer 3 is grown to form a stacked structure on an InP substrate 1 as shown in FIG. 5(a). The InP substrate 1 has a carrier concentration of $2 \times 10^{18}$ (cm$^{-3}$) and surface orientation of (111)A. Between the InP substrate 1 and the n-InGaAs layer 2 is formed an n-InP buffer layer (not shown) to lessen the influence of defects existing on the surface of the InP substrate 1. The n-InGaAs layer 2 and n-InGaAsP layer 21 have carrier concentrations of $1 \times 10^{16}$ cm$^{-3}$. The thicknesses of the n-InGaAs layer 2 and n-InGaAsP layer 21 are 1.5 μm and 0.5 μm, respectively. The n-InP layer 3 has a carrier concentration of $1.5 \times 10^{16}$ cm$^{-3}$ and thickness of 3 μm. These layers 2, 21 and 3 are grown to match the lattice of the (111)A-oriented surface of the InP substrate 1. Examplary compositions of the n-InGaAs layer 2 and n-InGaAsP layer 21 are $In_{0.47}Ga_{0.53}As$ and $In_{0.67}Ga_{0.33}As_{0.70}P_{0.30}$, respectively.

Figure 5B:
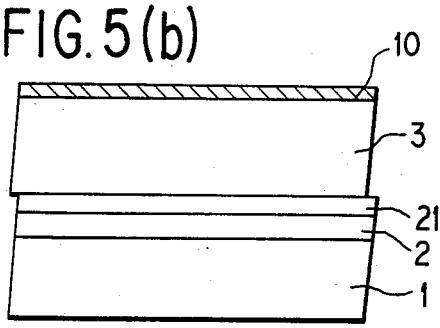

(b) A protecting film 10 of silicon dioxide (SiO$_2$) or silicon nitride (Si$_3$N$_4$) of a thickness in the range of 600 Å to 2000 Å is formed on the surface of the n-InP layer 3, as shown in FIG. 5(b), by using a conventional thin film technology including sputtering, chemical vapor deposition (CVD) or plasma excited CVD method.

Figure 5E:
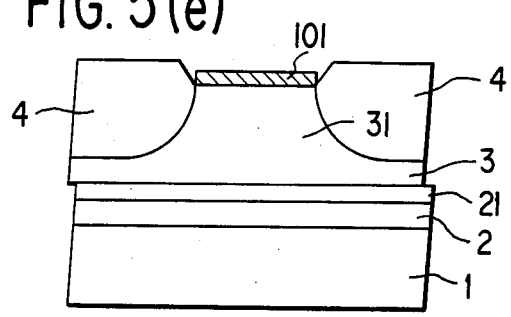
Figure 5F:
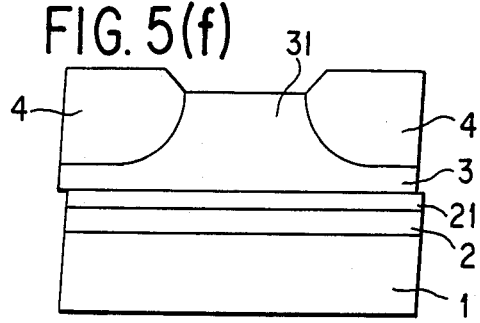
Figure 5C:
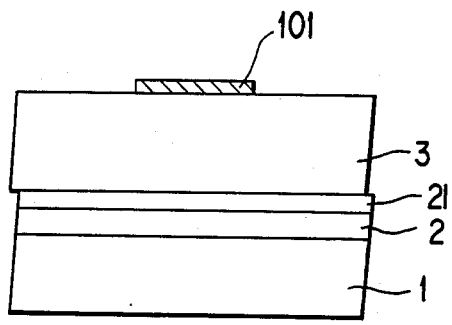

(c) The protecting film 10 is selectively removed by a conventional photolithographic technique, thereby a pattern (mask) 101 of the film, for example, a circle having a diameter of 100 μm is formed, as shown in FIG. 5(c).

Figure 5G:
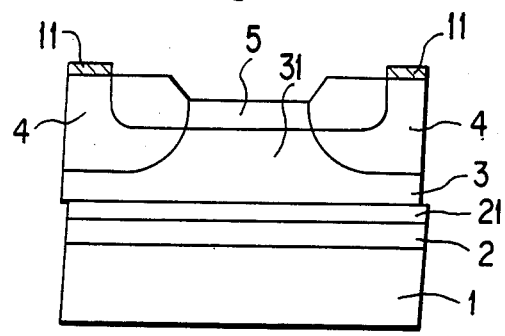
Figure 5D:
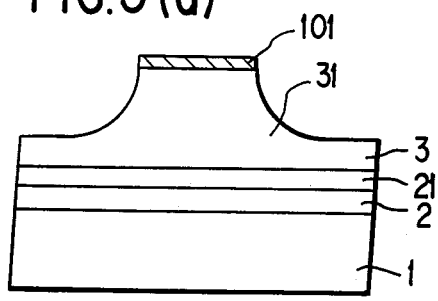

(d) By contacting an In-P molten mixture having a degree of unsaturation of 10° C., the unmasked portion of the n-InP layer 3 is selectively removed (melt-back). Thus, a mesa structure 31 of the InP layer 3 is formed under the masked portion as shown in FIG. 5(d). The maximum depth of the portion removed by the melt-back is about 2.5 μm. According to the melt-back method, the side surface of the mesa 31 usually has a slope spreading downward due to the sideward melt-back effect.

(e) An n⁻-InP layer 4 is selectively grown on the surface of the removed portion of the n-InP layer 3, as shown in FIG. 5(e), by using a conventional LPE technique, for example. This selective growth is made easy thanks to the mask 101 on which crystal growth does not take place. As a result, the n⁻-InP layer 4 having a flat surface parallel to the n-InGaAs layer 2 is obtained. The maximum thickness of the n⁻-InP layer 4 on the melt back surface of the n-InP layer 3 is approximately 2.8 μm, therefore, the surface level of the unmasked portion is about 0.3 μm higher than that of the masked portion.

(f) The mask 101 on the mesa 31 is removed as shown in FIG. 5 (f) by an appropriate chemical etching, for example. If the film 101 is composed of SiO$_2$ or Si$_3$N$_4$, a mixed solution of HNO$_3$ and HF of 1:1 in weight ratio can be used.

(g) Another masking layer (for example, SiO$_2$ film) 11 is selectively formed on the surface of the n⁻-InP layer 4 except for a predetermined area of the surface of n⁻-InP layer 4 around the mesa 31 which is exposed, and then, a p-type impurity is thermally diffused from the unmasked surface by using a conventional diffusion technique. Hence, respective p-type regions are formed in the mesa 31 and the n⁻-InP layer 4, as shown in FIG. 5(g). In the impurity diffusion, gaseous CdP$_2$, for example, as the source of the p-type impurity, is introduced into a closed tube heated at a temperature of 500° to 550° C. The diffusion depth of the p-type impurity is controlled to be 1.5 μm in the mesa 31 and 1.8 μm in the n⁻-InP layer 4. Thus, the pn junction formed as above extends substantially at the same level across the mesa 31 of the n-InP layer 3 into the n⁻-InP layer 4. The p-type-impurity doped region 5 of the mesa 31 functions as the window for the light sensitive region of the APD.

Figure 5H:
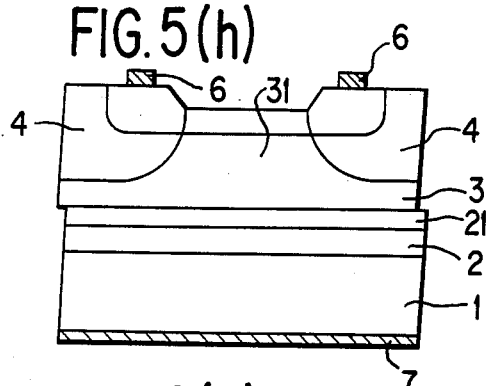

(h) A passivation layer (not shown) of Si$_3$N$_4$ for example, is coated on the entire surfaces of the mesa 31 and n⁻-InP layer 4 by using a conventional thin film technology. Then, an ohmic electrode 6 of Au-Zn, for example, is formed on the surface of the n⁻-InP layer 4 around the surface of the mesa 31 through a window formed in the passivation layer. Another ohmic electrode 7 of Au-Ge, for example, is formed on the backside surface of the InP substrate 1, as shown in FIG. 5(h). Thus, the APD of the first embodiment is completed.

Figure 6A:
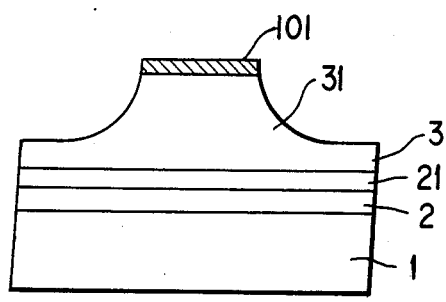
FIGS. 6(a) to 6(c) show the fabrication steps of the APD of the third embodiment, illustrating a cross-section at each step.
Figure 6B:
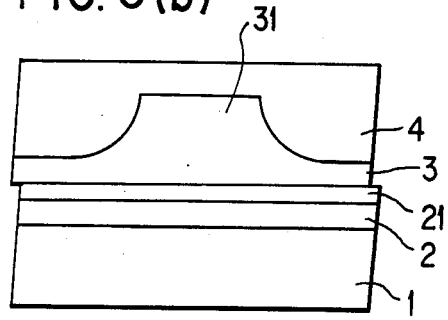
Figure 6C:
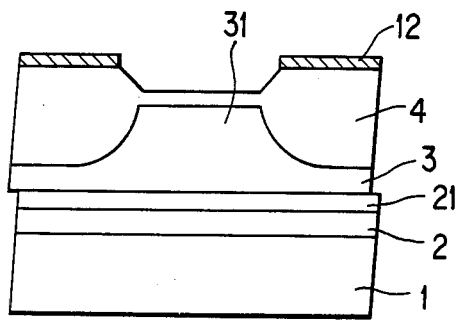

FIGS. 6(a) to 6(c) show the fabrication steps of the APD of the fourth embodiment, illustrating the cross-section at each step. Details of the steps are described in the following with reference to the figures.

FIG. 6(a) shows a structure of the APD at the step equivalent to FIG. 5(d). Different from the previous embodiments, the mask 101 is removed by using an appropriate chemical etching as described with reference to the step of FIG. 5 (f), and then, a second semiconductor layer 4, for example, an n⁻-InP layer, is grown using a LPE method so that the mesa 31 of the first semiconductor layer 3 is completely buried therein, as shown in FIG. 6(b). The maximum thickness of the second semiconductor layer 4 is about 2.8 μm, for the height of the mesa 31 is 2.5 μm. The second semiconductor layer 4 thus formed on the mesa 31 usually has a substantially flat surface.

Following the above step, another mask layer 12 (a SiO$_2$ film, for example,) is selectively formed on the surface of the second semiconductor layer 4 except the region on the top of the mesa 31, as shown in FIG. 6(c), by using a conventional thin film technology and photolithographic method. The unmasked surface of the second semiconductor layer 4 is, then, removed by a conventional chemical or other etching technique, until a predetermined magnitude of surface level difference, for example, 0.3 μm, or more, is provided between the respective surfaces of the unmasked and the masked portions.

By removing the mask layer 12, the structure equivalent to FIG. 5(f) is obtained. Subsequent steps including those for p-type impurity diffusion as shown in FIG. 5(g), aforementioned surface passivation and the electrode forming as shown in FIG. 5(h) are performed following the above step, and the fourth embodiment APD is completed.

If the maximum thickness of the second semiconductor layer 4 grown during the step of FIG. 6(b) is large enough to provide a sufficient level difference, more than 0.3 μm, between the respective surfaces on the mesa 31 and the region around the mesa 31, the pn junction can be formed to extend across the mesa 31 and the second semiconductor layer 4 at different levels as in the case shown in FIG. 3.

As disclosed for the above embodiments, since the APD of the present invention has a pn junction formed to extend across a multiplication region to a guard ring region substantially at the same level, or formed farther apart from a light absorbing layer in the guard ring region than in the multiplication region, the electrical field at each hetero-interface in the guard ring region can substantially be equal to or weaker than that at each corresponding hetero-interface in the multiplication region. Moreover, the breakdown voltage difference between the pn junction in the multiplication region and guard ring region is increased because of the increased distance between the pn junction and the hetero-interface in the guard ring region. Accordingly, the degree of latitude in the design parameters and process control in the fabrication and the operational margin of the APD can be increased. As a result, in the APD according to the present invention, the dark current, mainly caused by the tunnel current at the hetero-interfaces in the guard ring region, has been reduced to be in the range of 10 to 30 nA compared with 50 to 100 nA in the conventional APD, on average, without losing the guard ring effect achieved by the buried structure.

Figure 3A:
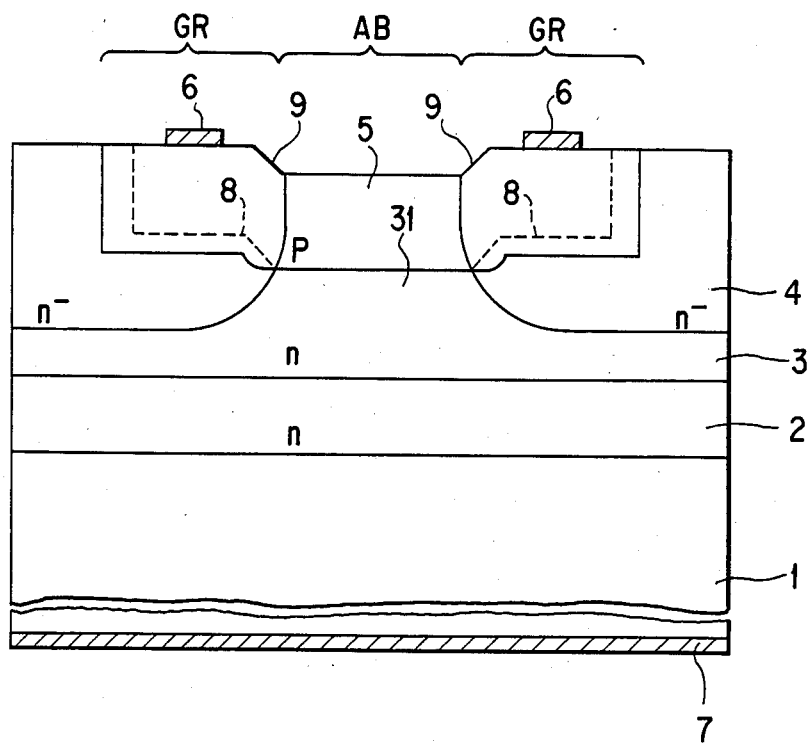

Although intermediate layer 21 is provided in the all embodiments, it can be omitted (as in the third embodiment of FIG. 3A) so that the multiplication layer 3 is formed directly on the absorbing layer 2, when the absorbing layer 2 is composed of an InGaAsP. And further, each of the semiconductor layers constituting an APD according to the present invention is not limited to the materials described above but could be selected from other III-V group compound semiconductor materials.

While the described embodiments represent the preferred form of the present invention, it is to be understood that modifications will occur to those skilled in the art without departing from the spirit of the invention. The scope of the present invention is therefore to be determined solely by the appended claims.

We claim:

1. An avalanche photodiode comprising:
a light absorbing semiconductor layer composed of a first semiconductor material having a first band gap allowing absorption of light to be detected, and doped with an impurity of a first conductivity type to a first concentration;
a first semiconductor layer provided on said light absorbing semiconductor layer, and composed of a second semiconductor material having a second band gap larger than said first band gap, and doped with an impurity of the first conductivity type to a second concentration at least as high as said first concentration, said first semiconductor layer having a mesa structure formed at a surface thereof opposite to said light absorbing semiconductor layer, said mesa providing a multiplication region;
a second semiconductor layer provided around said mesa of said first semiconductor layer, and composed of a third semiconductor material having a band gap at least as large as said second band gap, doped with an impurity of the first conductivity type to a concentration lower than said second concentration, said second semiconductor layer having a guard ring region formed therein, said guard ring region surrounding said mesa;
a first upper surface corresponding to said mesa and a second upper surface corresponding to said second semiconductor layer, said first upper surface being lower than said second upper surface with a predetermined distance therebetween; and
a pn junction formed by doping both of said first semiconductor layer in said multiplication region and said second semiconductor layer with a second conductivity type impurity at a concentration higher than said second concentration through said first and second upper surfaces, said pn junction extending across said mesa into said second semiconductor layer, wherein the distance between said pn junction and said light absorbing layer in said multiplication region is equal to or less than the distance between said pn junction and said light absorbing layer in said second semiconductor layer due to said distance between said first and second upper surfaces wherein said guard ring region is formed by the doping of said second semiconductor layer.

2. The avalanche photodiode of claim 1 wherein said mesa is covered with said second semiconductor layer.

3. An avalanche photodiode comprising:
a light absorbing semiconductor layer composed of a first semiconductor material having a first band gap allowing absorbtion of light to be detected, and doped with an impurity of a first conductivity type at a first concentration;
a first semiconductor layer provided on said light absorbing semiconductor layer so as to form a hetero-junction therebetween, and composed of a second semiconductor material having a second band gap larger than said first band gap, and doped with an impurity of the first conductivity type at a second concentration at least as high as said first concentration, said first semiconductor layer having a mesa structure formed at the surface thereof opposite to said light absorbing semiconductor layer, said mesa providing a multiplication region;
a second semiconductor layer provided around said mesa of said first semiconductor layer, and composed of a third semiconductor material having a band gap at least as large as said second band gap, doped with an impurity of the first conductivity type at a concentration equal to or lower than one-half of said second concentration, said second semiconductor layer having a guard ring region formed therein, said guard ring region surrounding said mesa wherein said guard ring region is formed by the doping of said second semiconductor layer.
a first upper surface corresponding to said mesa and a second upper surface corresponding to said second semiconductor layer, said first upper surface being lower than said second upper surface with a predetermined distance therebetween; and
a pn junction extending from said mesa into said second semiconductor layer, wherein said pn junction in said mesa is provided at a distance from the hetero-junction, said distance being determined by said second concentration so that the electrical field across the hetero-junction is higher in the multiplication region than in the guard ring region.

4. The avalanche photodiode of claims 1 or 3, wherein said second semiconductor layer is directly formed on said light absorbing layer.

5. The avalanche photodiode as set forth in either claim 1 or 3 wherein said light absorbing layer is composed of InGaAs or InGaAsP including an n-type impurity at a concentration in the range from $1 \times 10^{15}$ cm$^{-3}$ to $1 \times 10^{16}$ cm$^{-3}$.

6. The avalanche photodiode as set forth in either claim 1 or 3 wherein said first semiconductor layer is composed of InP including an n-type impurity at a concentration in the range from $1 \times 10^{16}$ cm$^{-3}$ to $2 \times 10^{16}$ cm$^{-3}$.

7. The avalanche photodiode as set forth in either 1 or 3 wherein said second semiconductor layer is composed of InP including an n-type impurity at a concentration in the range from $1 \times 10^{15}$ cm$^{-3}$ to $8 \times 10^{15}$ cm$^{-3}$.

8. The avalanche photodiode of claim 3, wherein said distance between said pn junction and the hetero-junction in the multiplication region is determined so that the product of said distance and said second concentration has a value in a range from $2.0 \times 10^{12}$ cm$^{-2}$ to $3.0 \times 10^{12}$ cm$^{-2}$.

9. The avalanche photodiode of claim 1 or 3, wherein said first semiconductor layer has a portion thereof extending between said second semiconductor layer and said light absorbing layer.

10. The avalanche photodiode of claim 1 or 3, wherein said first and second upper surfaces are connected by a sloping surface of said second semiconductor layer.

11. The avalanche photodiode of claim 1 or 3, further comprising:
a third semiconductor layer provided between said light absorbing semiconductor layer and said first semiconductor layer, and composed of a fourth senmiconductor material having a band gap larger than said first band gap and smaller than said second band gap, and doped with an impurity of the first conductivity type at a third concentration.

12. The avalanche photodiode of claim 11, wherein said third semiconductor layer extends to between said second semiconductor layer and said light absorbing layer.

13. The semiconductor photodetector of claim 11, wherein said third semiconductor layer is composed of InGaAsP including an n-type impurity at a concentration in the range from $1 \times 10^{15}$ cm$^{-3}$ to $2 \times 10^{16}$ cm$^{-3}$.

* * * * *